(12) United States Patent
Jiko et al.

(10) Patent No.: US 9,459,282 B2
(45) Date of Patent: Oct. 4, 2016

(54) ELECTRICAL CONTACT MEMBER

(75) Inventors: Norihiro Jiko, Kobe (JP); Takayuki Hirano, Kobe (JP)

(73) Assignee: Kobe Steel, Ltd., Kobe-shi (JP)

( * ) Notice: Subject to any disclaimer, the term of this patent is extended or adjusted under 35 U.S.C. 154(b) by 260 days.

(21) Appl. No.: 14/123,853

(22) PCT Filed: Jun. 15, 2012

(86) PCT No.: PCT/JP2012/065405
§ 371 (c)(1),
(2), (4) Date: Dec. 4, 2013

(87) PCT Pub. No.: WO2012/173243
PCT Pub. Date: Dec. 20, 2012

(65) Prior Publication Data
US 2014/0091823 A1    Apr. 3, 2014

(30) Foreign Application Priority Data
Jun. 15, 2011  (JP) .................................. 2011-133483

(51) Int. Cl.
*G01R 1/067* (2006.01)
*C23C 14/02* (2006.01)
*C23C 14/06* (2006.01)

(52) U.S. Cl.
CPC ............. *G01R 1/067* (2013.01); *C23C 14/025* (2013.01); *C23C 14/0605* (2013.01); *G01R 1/06738* (2013.01); *G01R 1/06755* (2013.01)

(58) Field of Classification Search
CPC .............. C23C 14/0605; G01R 1/067; G01R 1/06738; G01R 1/06755
USPC .................................................... 324/755.01
See application file for complete search history.

(56) References Cited

U.S. PATENT DOCUMENTS 6,007,349 A * 12/1999 Distefano ......... H01L 23/49811
257/E23.021
7,934,962 B2   5/2011 Hirano et al.
(Continued)

FOREIGN PATENT DOCUMENTS

CN      102033144 A    4/2011
JP      8 236903       9/1996
(Continued)

OTHER PUBLICATIONS

International Search Report Issued Sep. 11, 2012 in PCT/JP12/065405 Filed Jun. 15, 2012.
(Continued)

*Primary Examiner* — Benjamin M Baldridge
(74) *Attorney, Agent, or Firm* — Oblon, McClelland, Maier & Neustadt, L.L.P.

(57) ABSTRACT

Provided is an electrical contact member which is capable of maintaining stable conductivity over a long period of time, while achieving low adhesion to a test subject, in particular, an electrical contact member which is capable of maintaining stable electrical contact over a long period of time by suppressing increase in the contact resistance, while achieving low adhesion to a test subject even after repeated contact at high temperatures around 85° C. or after being left in the atmosphere for a long period of time. The present invention relates to an electrical contact member, which repeatedly comes into contact with a test subject, and wherein the surface of the electrical contact member, said surface coming into contact with the test subject, is configured of a carbon coating film that contains Pd.

15 Claims, 1 Drawing Sheet

CARBON COATING FILM (C+Pd)

MIXED LAYER (Cr+C+Pd) ⎫
METAL ADHESION LAYER (Cr) ⎬ INTERMEDIATE LAYER
METAL ADHESION LAYER (Ni) ⎭

PLATING

BASE

(56) References Cited

U.S. PATENT DOCUMENTS

| | | | | |
|---|---|---|---|---|
| 2006/0113603 | A1* | 6/2006 | Currie | H01L 27/1203 257/368 |
| 2009/0310743 | A1* | 12/2009 | Carpenter | C12Q 1/004 378/45 |
| 2010/0044967 | A1* | 2/2010 | Esser | F16J 9/26 277/442 |
| 2010/0239942 | A1* | 9/2010 | Nakagawa | H01M 8/0232 429/479 |
| 2011/0214900 | A1* | 9/2011 | Hirano | H01B 5/00 174/126.2 |
| 2011/0229791 | A1* | 9/2011 | Kageyama | H01M 8/0228 429/469 |
| 2011/0254431 | A1* | 10/2011 | Hirakawa | B82Y 10/100 313/326 |
| 2013/0049784 | A1* | 2/2013 | Hirano | G01R 1/06761 324/755.01 |

FOREIGN PATENT DOCUMENTS

| | | | |
|---|---|---|---|
| JP | 2001 289874 | | 10/2001 |
| JP | 2001289874 A | * | 10/2001 |
| JP | 3336682 | | 8/2002 |
| JP | 2003 142189 | | 5/2003 |
| JP | 2003 149267 | | 5/2003 |
| JP | 2006038641 A | * | 2/2006 |
| JP | 2007-24613 A | | 2/2007 |

OTHER PUBLICATIONS

Written Opinion of the International Searching Authority Issued Sep. 11, 2012 in PCT/JP12/065405 Filed Jun. 15, 2012.

* cited by examiner

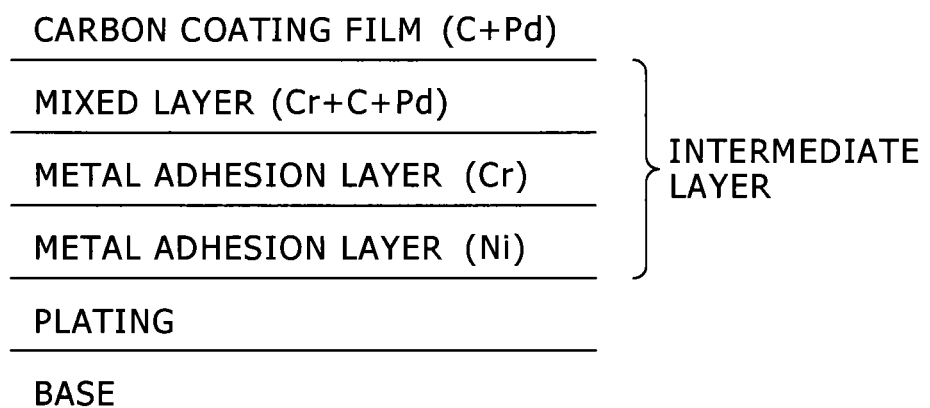

ELECTRICAL CONTACT MEMBER

TECHNICAL FIELD

The present invention relates to an electrical contact member, such as a contact probe, that is used to examine electrical properties of a semiconductor element, and is repeatedly brought into contact, at its tip, with a test subject such as an electrode. The invention relates particularly to an electrical contact member having such an excellent endurance that the member is not deteriorated in electroconductivity even when subjected to a repetitive examination at high temperature, or allowed to stand still in the atmosphere; and a connecting device for examination, such as a socket for examination, a probe card or an examining unit, that has the electrical contact member.

BACKGROUND ART

About integrated circuits (ICs), large scale integrated circuits (LSIs), and light emitting diodes (LEDs) and other electronic components (that is, electronic components each having at least one semiconductor element), electrical properties thereof are examined by bringing an electrical contact member (contact probe) used in a connecting device for examination into contact with an electrode of the semiconductor element. The electrical contact member is required to have not only a good electroconductivity (a low contact resistance value) but also such an excellent endurance that the member is not worn away or damaged even when repeatedly brought into contact with the electrode, which is a test subject.

The contact resistance value of the electrical contact member is generally set to 100 mΩ or less. However, when a test subject is repeatedly examined therewith, the contact resistance value may be deteriorated into a value from several hundred milliohms to several ohms. Conventionally, therefore, the electrical contact member is periodically cleaned or exchanged with another member. However, such an operation remarkably decreases the reliability of the examining step or the operating rate of the connecting device for examination. Thus, development has been advanced about electrical contact members that are not lowered in contact resistance value even when repeatedly used over a long term. In particular, when an electrode that is a test subject is soldered, plated with tin (Sn) or subjected to some other treatment, the surface of the electrode is shaved away by contacting thereof with an electrical contact member since the solder or tin is soft. Thus, the electrical contact member has a property that wastes, shavings, or the like therefrom adheres easily to the tip portion of the electrical contact member. Furthermore, the adhering solder or tin is being oxidized so that the contact resistance value is not easily kept at a stable level.

For example, Patent Literatures 1 to 3 disclose a method for stabilizing the contact resistance value of an electrical contact member. Of these literatures, Patent Literature 1 discloses an amorphous hard coat made mainly of carbon, or carbon and hydrogen; to this coat, an impurity element other than carbon and hydrogen being added in the range of 0.001 to 40% by atom, and this element being selected from the group consisting of V, Cr, Zr, Nb, Hf, Ta, Au, Pt and Ag; thereby having an excellent abrasion resistance and a high electroconductivity, being small in film stress, and having a good sliding property. The literature states that this hard coat is favorably applicable to a sliding region for which electrical contacting is required.

Patent Literature 2 discloses a probe made of tungsten or rhenium tungsten, wherein a DLC film is formed onto at least a tip portion of a contact region of the probe at the tip of the probe, and the DLC film contains, in a proportion of 1 to 50% by mass, at least one metal of tungsten, molybdenum, gold, silver, nickel, cobalt, chromium, palladium, rhodium, iron, indium, tin, lead, aluminum, tantalum, titanium, copper, manganese, platinum, bismuth, zinc, and cadmium. The literature states that the probe having this structure does not easily undergo adhesion of aluminum wastes even when repeatedly brought into contact with an aluminum electrode, and makes it possible to stabilize the contact resistance into a low value even when not frequently cleaned.

Patent Literature 3 discloses an electrical-property-measuring probe about which at least a surface of a probe material thereof to which ions are to be implanted is made mainly of any one, or two or more of beryllium-copper alloy, copper, silver, gold, nickel, palladium, platinum, rhodium, rhenium, chromium, molybdenum and tungsten. Patent Literature 3 states that in order to cause the probe to exhibit an alien-substance-adhering effect onto the topmost surface of the probe, the average carbon concentration in a shallow region of the probe from the topmost surface to a depth of 50 nm is controlled into about 1 to 80% by atom, whereby the probe does not easily undergo adhesion of any alien substance even when repeatedly brought into contact with an element-side-electrode (made of solder, or the like) so that the frequency of cleaning can be decreased.

CITATION LIST

Patent Literatures

[PTL 1] Japanese Patent No. 3336682
[PTL 2] JP 2001-289874 A
[PTL 3] JP 2003-149267 A

SUMMARY OF INVENTION

Technical Problem

According to the above-mentioned methods, it is expected that an electrical contact member can be provided which can endure a repetitive examination at room temperature. However, the environment wherein an electrical contact member is used is various; thus, the member may be used at a high temperature severer than room temperature. When an electrical contact member is used, for example, in a repetitive examination at a high temperature of about 85° C., an electrode member of Sn or the like that is heated to the high temperature comes into contact with the electrical contact member, so that the adhesion percentage of Sn onto the electrical contact member is largely increased. This causes serious problems, for example, a problem that the electrical contact member is remarkably made high in electroconductivity. However, the above-mentioned techniques of Patent Literatures 1 to 3 have not been investigated from such a viewpoint. In the case of bringing, into contact with a Sn electrode or the like at high temperature, a probe containing various additive elements in respective quantities over wide ranges as disclosed in these patent literatures, Sn shaven away from the electrode adheres in a large quantity onto the surface of the electrical contact member. The probe is lowered in electroconductivity by the oxidization of the adhering Sn. It is therefore feared that the probe rises in contact resistance. Thus, the probe cannot ensure stable electrical contacting over a long term.

Some electrical contact members are not used immediately after their package is opened; thus, the members may be allowed to stand still in the package-opened state in the atmosphere, for example, inside a room over several weeks. In such a case, the oxidization of their metal elements advances so that the electrical contact members are lowered in electroconductivity. An electrical contact member fitted to an examining device is also raised in contact resistance by the oxidization of its metal elements when subjected to a temperature-raising/temperature-lowering process or when the test subject is exchanged with a test subject.

In light of the above-mentioned situation, the present invention has been made. An object thereof is to provide an electrical contact member capable of realizing a low adhesiveness to a test subject (such as solder, Sn, Al or Pd) and further keeping a stable electroconductivity (evaluatable through contact resistance value) over a long term, particularly, an electrical contact member capable of having realized a low adhesiveness to a test subject and having been restrained from rising in contact resistance even after subjected to repetitive contacting at a high temperature of about 85° C., or allowed to stand still in the atmosphere over a long term, so as to make it possible to keep stable electrical contacting over a long term; and a connecting device for examination that has this member.

Solution to Problem

The invention provides the following electrical contact member, and connecting device for examination:

(1) An electrical contact member that is to come into contact with a test subject repeatedly,
wherein a surface of the member that is to come into contact with the test subject is configured to be a carbon coating film containing Pd.

(2) The electrical contact member according to item (1), wherein the content by percentage of Pd contained in the carbon coating film is from 10 to 50% by atom.

(3) The electrical contact member according to item (2), wherein the content by percentage of Pd contained in the carbon coating film is from 10 to 23% by atom.

(4) The electrical contact member according to item (1), wherein the carbon coating film has a thickness of 5 nm to 10 μm.

(5) The electrical contact member according to item (2), wherein the carbon coating film has a thickness of 5 nm to 10 μm.

(6) The electrical contact member according to item (3), wherein the carbon coating film has a thickness of 5 nm to 10 μm.

(7) The electrical contact member according to item (1), wherein when the carbon coating film has a thickness of 5 nm to 10 μm, the content by percentage of Pd contained in the carbon coating film is from 10 to 23% by atom, and
when the carbon coating film has a thickness of 5 to 200 nm, the content by percentage of Pd contained in the carbon coating film is from 10 to 50% by atom.

(8) The electrical contact member according to any one of items (1) to (7), about which the test subject to be examined contains Sn.

(9) A connecting device for examination, comprising the electrical contact members as recited in any one of items (1) to (7).

(10) A connecting device for examination, comprising the electrical contact members as recited in item (8).

Advantageous Effects of Invention

In the electrical contact member of the invention, a surface thereof that is to come into contact with a test subject is configured to be a carbon coating film containing Pd; and preferably the Pd content by percentage in the carbon coating film is appropriately controlled. Thus, the member makes it possible to have realized a low adhesiveness onto a test subject and have been restrained from rising in contact resistance even after subjected to repetitive contacting at a high temperature of about 85° C., or allowed to stand still in the atmosphere over a long term. Consequently, the member can keep stable electrical contacting over a long term.

BRIEF DESCRIPTION OF DRAWING

FIG. 1 is a schematic sectional view illustrating the structure of a tip portion of an electrical contact member used preferably in the invention, this tip portion being to come into contact with a test subject.

DESCRIPTION OF EMBODIMENTS

The inventors have made investigations from a viewpoint that has not been sufficiently investigated about techniques related to conventional electrical contact members, that is, the viewpoint of the supply of an electrical contact member usable under severe situations, such as a situation that the member is put in a high-temperature test environment or allowed to stand still in the atmosphere over a long term. As a result, the inventors have found out that the expected object is attained by use of an electrical contact member wherein a carbon coating film on a tip portion that is to come into contact with a test subject is configured to contain Pd. Thus, the invention has been accomplished.

As disclosed in the above-mentioned patent literatures, it has been known so far that many metals, a typical example of which is Pd, are located in a carbon coating film constituting an electrical contact member. However, it has not been known that out of the metals, in particular, Pd is a metal for causing the member to ensure the use thereof under the above-mentioned severe conditions. This is a finding that has been unprecedentedly discovered by the inventors.

In the present specification, a wording such as the wording "a member has been restrained from rising in contact resistance even after subjected to a repetitive high-temperature examination" means that as will be described in Examples mentioned later, the contact resistance value thereof has been less than 300 mΩ on average after the member is brought into contact with a Sn electrode at 85° C. 100,000 times.

In the present specification, a wording such as the wording "an electrical contact member has been restrained from rising in contact resistance even after allowed to stand still at high temperature over a long term" means that as will be described in Examples mentioned later, after the electrical contact member is produced and then allowed to stand still at room temperature (temperature: 23° C., and humidity: 50% in the atmosphere) for 2 weeks, a rise in the contact resistance value thereof from the value just after the start of the standing-still has been restrained to less than 300 mΩ.

Hereinafter, the electrical contact member of the invention will be described in detail with reference to FIG. 1. FIG. 1 is a view illustrating an example of a tip portion of an electrical contact member used preferably in the invention, this tip portion being to come into contact with a test subject. This view schematically illustrates the structure of any sample in Examples mentioned later. However, the structure of the invention is not limited to that in FIG. 1. For example, FIG. 1 illustrates a structure wherein from the vicinity of a base, the following are successively formed as an intermediate layer: metal adhesion layers containing different metals (Ni, and subsequent Cr in FIG. 1), and a mixed layer formed on the adhesion layers and containing Cr originating from the underlaid adhesion layers and C and Pd originating from a carbon coating film. However, the invention is not intended to be limited to this structure. The respective compositions of the metal adhesion layers and the mixed layer are never intended to be limited to ones made of the elements shown in FIG. 1, either.

Generally, in an electrical contact member, a tip portion thereof (a portion usually called a plunger), which is to come into contact with a test subject, is roughly divided, successively from the test subject side thereof, into a carbon coating film that is to come into contact with the test subject directly, and a base. As has been illustrated in FIG. 1, between the base and the carbon coating film, the intermediate layer may be formed to heighten the adhesiveness between the two. As has been illustrated in FIG. 1, a plating layer may be formed on the base.

The electrical contact member of the invention is characterized in that its carbon coating film contains Pd.

As described above, from many metals, Pd is selected as a metal for having reduced the adhesiveness of the electrical contact member onto a test subject even after a repetitive examination at high temperature and even after standing-still in the atmosphere over a long term, whereby the member can be decreased in contact resistance. Even when a metal other than Pd is used, the desired advantageous effect is not obtained. This matter is as demonstrated in Examples mentioned later. Pd is excellent in effect of preventing the adhesion of metals (such as Sn) contained in a test subject, and further has an effect of restraining a rise in the contact resistance value by the oxidization of inevitable impurities contained in the carbon coating film, which constitutes the member (such as Fe, V, Al and Ga, which can be inevitably incorporated into the film in the production process or some other process). Thus, the above-mentioned advantageous effect would be effectively exhibited. In the carbon coating film, Pd is present in the form of not a carbide but a metal having an amorphous structure.

Unclear are detailed reasons why among many metals, Pd is excellent in the above-mentioned properties. In the case of using, for example, Ru, which is a noble metal element in the same manner as Pd, Ru is able to have reduced the contact resistance after a Ru-containing electrical contact member is allowed to stand still at room temperature, as will be shown in Examples mentioned later, but Sn has adhered to the surface thereof after a repetitive examination at high temperature so that the contact resistance has remarkably risen (see No. 13 in Table 1 and No. 10 in Table 2). Noble metal elements have a property of not being easily oxidized; thus, it is conceivable that Ru intrinsically produces the same result as Pd. However, it has been unexpected for the inventors that the shown experimental results have been obtained. It is presumed that Ru makes the Sn adhesion resistance low at high temperature for some reason. Considering only a decrease in the contact resistance by oxidization, the addition of, for example, Au or Ag is conceivable. However, Au and Ag each aggregate in the carbon coating film to make the carbon coating film largely low in mechanical strength. Thus, these elements are not useful.

The content by percentage of Pd contained in the carbon coating film ranges preferably from 10 to 50% by atom, more preferably from 10 to 23% by atom. In this case, the above-mentioned properties come to be effectively exhibited (see Examples mentioned later). The above-mentioned patent literatures disclose an electrical contact member wherein many metals are contained in a carbon coating film in respective contents by percentages in wide ranges. The inventors have verified that in order to cause an electrical contact member to exhibit the desired properties certainly, it is effective that Pd is incorporated thereinto in a proportion within a specific narrow range. Furthermore, the inventors have made it clear that the Pd content by percentage in the carbon coating film can be set in accordance with the film thickness of the carbon coating film, more specifically, the Pd content is allowable up to a higher concentration when the film thickness is small. The film thickness of the carbon coating film, and the Pd content in the carbon coating film may be somewhat varied in accordance with individual sites of the electrical contact member. This would be based on the shape of the electrical contact member, a method for forming its films, conditions for the film formation, and others. In the invention, the film thickness of the carbon coating film, and the Pd content in the carbon coating film each denote a value thereof on a plane of the electrical contact member which is perpendicular to the axial line of the member (for example, a sharp tip portion of the member).

Detailedly, the lower limit of the Pd content by percentage in the carbon coating film is preferably 10% or more by atom. If the Pd content is less than 10% by atom, the contact-resistance-decreasing effect based on the addition of Pd is not effectively exhibited so that after the above-mentioned test the contact resistance has been increased. A reason therefor is presumed as follows: the carbon coating film contains not Pd but also impurity elements incorporatable inevitably in the production process and other processes, and these impurity elements are oxidized. If the Pd content is less than 10% by atom, the amount of Sn adhering onto the electrical contact member surface has been increased, in particular, after a high-temperature test.

Contrarily, the upper limit of the Pd content by percentage in the carbon coating film is preferably set to 23% or less by atom. The contact-resistance-decreasing effect of Pd tends to be made better as the Pd content in the carbon coating film is made larger. However, to decrease the contact resistance value to a desired level, it is sufficient that the Pd content is 20% by atom. The addition in this proportion or more is not economical since Pd is an expensive metal. If the Pd content is more than 23% by atom, the electrical contact member is further lowered in adhesiveness to a test subject in a high-temperature test so that the adhering Sn amount increases.

The upper limit of the Pd content by percentage in the carbon coating film is allowable up to 50% by atom in some cases. When the film thickness of the carbon coating film ranges, particularly, from 5 to 200 nm, the Pd content can be from 10 to 50% by atom. In such cases also, the adhesion of Sn can be restrained. A progress in which this embodiment has been found out is as follows:

Hitherto, the adhesion of Sn onto an electrical contact member has been evaluated in a plane of the member which is perpendicular to the axial line thereof. However, when the material of a partner electrode as a test subject is Sn alloy, the Sn alloy deforms in contacting thereof with the member, so that the Sn alloy adheres also onto an inclined surface of the probe continuous from the tip thereof. The inventors have investigated to find out that: in many cases of the adhesion of Sn, the adhesion starts from an inclined surface (for example, a surface inclined from the axial line by about 40 to 50°) of an electrical contact member rather than a surface thereof perpendicular to the axial line, so that the member gradually coats the whole of the electrical contact member; consequently, the contact resistance becomes unstable. Thus, in the invention, the inventors have investigated factors affecting the Sn adhesion onto the inclined surface from a viewpoint that the Sn adhesion onto the inclined surface should be restrained.

As a result, the inventors have found out that a correlative relationship exists between the surface roughness of the inclined surface and the Sn adhesion, and further that the surface roughness of the inclined surface is affected by the film thickness of the carbon coating film and the Pd content by percentage in the carbon coating film. As will be detailed in Example 3 described later, it has been made clear that: when the arithmetic average roughness Ra of the inclined surface is about 3 nm or less, the effect of restraining the Sn adhesion can be effectively exhibited; and it is advisable for attaining the exhibition to set the film thickness of the carbon coating film into the range of 5 to 200 nm, and set the Pd content in the carbon coating film into that of 0 to 50% by atom (in terms of values on a surface of the electrical contact member which is perpendicular to the axial line thereof).

From the above-mentioned viewpoint, in the invention, the Pd content by percentage in the carbon coating film is specified preferably into the range of 10 to 50% by atom, more preferably 10 to 23% by atom. The Pd content is even more preferably from 11 to 22% by atom both inclusive, even more preferably from 12 to 21% by atom both inclusive. The composition of any carbon coating film is measurable by EPMA or auger electron spectrometer. Moreover, a good correlation exists between the concentration of a metal element, and the electrical resistance. Thus, by gaining this relationship beforehand by EPMA or some other method, the concentration can be simply decided from the electrical resistance.

Any electrical contact member wherein a carbon coating film as described above contains Pd in any one of the predetermined contents by percentage is included within the scope of the invention. Thus, the distribution form of Pd in the carbon coating film is not particularly limited. For example, Pd may be present in a state of being evenly dispersed in the carbon coating film, or in a state that the concentration of Pd is changed in the carbon coating film by a change in conditions for the sputtering, or others.

In order to realize certainly a low adhesiveness of the member onto a test subject, and a decrease in the contact resistance, the carbon coating film preferably has a thickness in a predetermined range. The thickness is preferably from about 5 nm to about 10 μm both inclusive. The formation of the carbon coating film does not easily cause the oxidization of the carbon coating film itself, so as to restrain the invasion of oxygen effectively from the electrical contact member surface into the carbon coating film, and further restrain the invasion of oxygen into the intermediate layer (for example, the mixed layer and the metal adhesion layers in FIG. 1) underneath the carbon coating film.

Detailedly, the inventors have made the above-mentioned high-temperature test, and others to examine a change in the contact resistance of an electrical contact member with time, thus finding out that when a preferred thickness of its carbon coating film is 5 nm or more, the contact resistance can be decreased into a desired level. The lower limit of the carbon coating film is more preferably 7 nm or more, even more preferably 10 nm or more. As the film thickness of the carbon coating film is larger, the member is better in endurance. However, if the carbon coating film is too thick, for example, the following problems arise: the film increases in surface roughness and is further peeled away by internal stress; and the electrical contact member rises in contact resistance. The upper limit of the carbon coating film is preferably set to 10 μm. The upper limit of the Pd-containing layer is more preferably 5 μm or less, even more preferably 2 μm or less (even more preferably 600 nm or less, even more preferably 400 nm or less).

In the invention, it is preferred that the film thickness of the carbon coating film is from 5 nm to 10 μm (preferably from 5 to 600 nm, more preferably from 5 to 400 nm) and the Pd content by percentage in the carbon coating film is from 10 to 23% by atom. In the invention, the content of Pd contained in the carbon coating film can be set in accordance with the film thickness of the carbon coating film. When the film thickness is, particularly, from 5 to 200 nm out of the above-mentioned film thicknesses, the upper limit of the Pd content is allowable up to 50% by atom (that is, the Pd content is from 10 to 50% by atom, preferably from 15 to 40% by atom, more preferably from 20 to 35% by atom).

A characteristic of the invention is in that a surface (carbon coating film) of an electrical contact member that is to come into contact with a test subject is configured to contain Pd. Structures other than this characteristic are not particularly limited. Thus, structures used ordinarily in the technical field of electrical contact members can be appropriately selected to be adopted.

For example, the carbon coating film in the invention is preferably a carbon coating film that is amorphous over the whole thereof, and is high in hardness and excellent in sliding property, a typical example of the film being a diamond-like carbon (DLC) film. Such a carbon coating film is not worn away even when repeatedly brought into contact with a partner member, and does not undergo adhesion of the partner member thereto. Moreover, the film is amorphous; thus, the possibility is small that irregularities in the surface are increased.

The carbon coating film may contain a metal other than Pd and a carbide thereof as far as these do not produce a bad effect onto the effect of the invention. Specifically, the carbon coating film may contain only Pd, or may contain one or more of, for example, W, Ta, Mo, Nb, Ti and Cr as the metal other than Pd.

The content by percentage of the content of the metal(s) other than Pd is controlled preferably to about 10% or less by atom, more preferably to about 5% or less, considering the contact resistance value required when the member is examined, and other factors. If the content of the metal(s) other than Pd is too large, the metal(s) is/are oxidized to raise the contact resistance and lower the Sn adhesion resistance in a high-temperature examination.

The carbon coating film having such a layer structure (and further an intermediate layer as described above, which will be detailed later) can be formed by various film-depositing methods, such as a chemical vapor deposition method (CVD method), a sputtering method, and an arc ion plating method (AIP) method. It is preferred to use a sputtering method or AIP method since the carbon coating film is easily formed to have a low electrical resistance, and a metal element is easily introduced into the carbon coating film. In particular, a sputtering method is most preferred since a good carbon coating film can be formed. Specifically, a carbon coating film intrinsically has a property of having a diamond structure or graphite structure. In order to gain a sufficient hardness and a low electroconductivity, the film desirably has an amorphous structure, which is an intermediate structure between the two structures. A sputtering method most easily gives this structure, and hardly causes the incorporation of hydrogen, which suffocates the electroconductivity.

For the base laid underneath above-mentioned carbon coating film, the following is preferably used, considering strength and electroconductivity: beryllium copper (Be—Cu), palladium (Pd), tungsten (W) or iridium (Ir), or any alloy of the metal; or carbon tool steel. If necessary, the upper surface of the base (between the carbon coating film and the base) may be plated with, for example, Au-based plating material.

Between the base or the plating thereon (called the "base-group-member" hereinafter), and the carbon coating film, it is preferred to form an intermediate layer (as described above) for heightening the adhesiveness therebetween for the following reasons: the base-group-member and the carbon coating film are originally poor in adhesiveness therebetween; and when formed, the carbon coating film has remaining compressive stress by a difference in thermal expansion coefficient between the film and the metal constituting the base-group-member, so as to be easily peeled at the interface therebetween. The intermediate layer may be a known intermediate layer. For example, intermediate layers described in JP 2002-318247 A can be referred to. Specific examples of the intermediate layer include a layer having at least one metal adhesion layer made of a metal good in adhesiveness to the base (such as Ni), or an alloy thereof, and a layer wherein on the metal adhesion layer is formed a mixed layer including the same metal (such as Ni) as the metal adhesion layer contains, the same metal element (such as Pd) as contained in the carbon coating film, and carbon. This mixed layer may be an inclined layer about which the carbon content by percentage in the inclined layer continues to be increased from the base side to the carbon coating film side. It is advisable to select, as the metal used in the metal adhesion layer, an appropriate metal in accordance with the species of the base-group-member. When the base-group-member (in particular, the plating) is made of a Au based material, it is preferred to use Ni. By laying an appropriate intermediate layer in this way in accordance with the base-group-member, the resultant electrical contact member can realize an excellent endurance. As has been illustrated in FIG. 1, for example, in Examples mentioned later, a mixed layer (Cr+C+Pd) is formed on a metal adhesion layer (Cr), and further the concentrations of the elements in the mixed layer are adjusted to be stepwise changed. By the formation of such a mixed layer, stress in the mixed layer is also stepwise changed so that the mixed layer can be effectively prevented from being peeled off from the base. Furthermore, the electroconductivity of the mixed layer is also improved since the mixed layer contains Cr and Pd.

A typical form of the electrical contact member of the invention is a contact probe pin. Other examples thereof include flat-spring-form electrical contacts, and electrical contacts in other forms. This is because these forms may each have a site corresponding to a corner (such as a corner region of the flat spring, or a semispherical projection) so that a shearing force as described above may be generated. Also in a contact pin probe as described above, various shapes are known about its contacting region (region which is to come into contact with a test subject). Examples of the shapes include two-divided, three-divide, and four-divided shapes (or a non-divided shape). The electrical contact member of the invention includes, in a scope thereof, all electrical contact members having these regions, respectively.

For a test subject (electrode) to be examined by use of the electrical contact member of the invention, solder is usually used. This basically contains Sn. This metal, Sn, is a metal adhering easily, particularly, to the surface of the contact probe pin. Accordingly, when the test subject is made of Sn or a Sn alloy, the application of the electrical contact member of the invention exhibits the advantageous effects thereof especially effectively.

The invention includes, in a scope thereof, any connecting device for examination that has plural electrical contact members as described above. The number of the electrical contact members is not particularly limited, and may be appropriately set in accordance with the species or shape of the test subject.

The invention will be more specifically described by way of the following examples; however, the invention is not limited by the examples. The examples may each be carried out in the state that an appropriate modification is added thereto as far as the resultant is matchable to the subject matters of the invention that have been described hereinbefore and will be described hereinafter. All the modified examples are included in the technical scope of the invention.

EXAMPLES

Example 1

In the present example, electrical contact members each having a carbon coating film containing any one of various metal elements shown in Table 1 were produced to examine the usefulness of Pd (effect of having decreased the contact resistance after the members were allowed to stand still at room temperature for a long period).

Specifically, in this example, as each contact probe, a spring built-in probe was used, the tip of which was divided into four regions. This contact probe (YPW-6XT03-047, manufactured by Yokowo Co., Ltd.) is a probe in which the topmost surface of a Be—Cu base is plated with Au—Co alloy.

Next, a sputtering method was used to deposit an intermediate layer, for heightening the adhesiveness between the base and a carbon coating film to be formed thereon, and the carbon coating film successively.

Specifically, a DC magnetron sputtering apparatus was first used to deposit, onto the above-mentioned Au-based plating, Ni into a thickness of 50 nm, and Cr into a thickness of 50 nm in this order. Detailed conditions for the sputtering were as follows:

Ultimate vacuum degree: $6.7 \times 10^{-4}$ Pa,
Targets: Ni target, and Cr target,
Each target size: 6 inches in diameter,
Ar gas pressure: 0.13 Pa,
Sputtering electric power: 500 W, and
Base bias: 0 V Next, the following was deposited into a thickness of 100 nm onto the Cr film: a mixed layer of Cr, and carbon containing the same additive element (the species of the element is shown in Table 1) as contained in a carbon coating film to be formed after this time. Specifically, in the mixed layer, the ratio between Cr and carbon containing the additive element was changed at intervals of a thickness of 20 nm into 5 stages by adjusting electric powers to be charged, respectively, into individual targets (a Cr target, and a composite target in which a chip of the additive element was put on a carbon target) into the range of 114 to 34 W and into that of 59 to 935 W, respectively. By using such a way to lay, between the metal adhering layer (Cr) and the carbon coating film, the mixed layer, wherein the concentrations (Cr and the additive element) are changed step by step, stress in these films also changes step by step so that one or more of the films can be effectively prevented from being peeled off from the base.

Thereafter, a carbon coating film containing any one of the elements shown in Table 1 (as the carbon coating film described just above) was deposited into a thickness of 400 nm. Detailed conditions for sputtering therefor were as follows:

Target: a composite target in which chips of the additive element were put on a carbon target,
Ar gas pressure: 0.13 Pa,
Sputtering electric power: 1000 W,
Base bias: −40 V, and
Target size: 6 inches in diameter.

The contact probes obtained as described above, each of which had the carbon coating film, were each allowed to stand still at room temperature (temperature: 23° C., and humidity: 50% in the atmosphere), and a measurement was made about the value of the contact resistance with an electrode made of a lead-free solder ("Sn"-"3%-by-atom-Ag"-"0.5%-by-atom-Cu") with the passage of time (at a time just after the production, and a time after standing-still for 2 weeks). The measurement of the contact resistance value was made by a method of using the so-called Kelvin connection, which is a method of connecting two lines to the lead-free electrode, connecting two lines also to a Au electrode in contact with the side of the contact probe opposite to the lead-free electrode side thereof, applying electric current to one line of each of the two line pairs, and then measuring the voltage of each of the respective other lines, this method being capable of measuring the internal resistance of the contact probe itself, the respective contact resistances to the upper and lower electrodes, and the respective internal resistances of the upper and lower electrodes, and cancelling any resistance component other than these resistances.

In this way, just after the start of the standing-still and the standing-still for the two weeks, the measurement was made about the contact resistance value (the resistance of the body of the probe, the contact resistances, and the internal resistances of the electrodes). The same operation was repeated 5 times (n=5). The average thereof was calculated. In this case, when the rise from the contact resistance just after the start of the standing-still to that after the standing-still for the two weeks was less than 300 mΩ, the electrical contact member was judged to be O. When the rise was 300 mΩ or more, the member was judged to be X.

These results are also shown in Table 1. In Table 1, symbols of "E+03" each denote "×10³". Just after the start of the standing-still, the contact resistance of each of the contact probes was a very low value of 35 to 55 mΩ although the value is not shown in Table 1.

TABLE 1

| No | Additive element (% by atom) | Contact resistance change (mΩ) with time | Judgment |
|---|---|---|---|
| 1 | Not added | 1.6E+03 | X |
| 2 | Pd 2.7% | 8.1E+02 | X |

TABLE 1-continued

| No | Additive element (% by atom) | Contact resistance change (mΩ) with time | Judgment |
|---|---|---|---|
| 3 | Pd 10.3% | 2.9E+02 | O |
| 4 | Pd 12.4% | 1.4E+02 | O |
| 5 | Pd 15.4% | 7.0E+01 | O |
| 6 | Pd 29.3% | 2.8E+01 | O |
| 7 | W 15.3% | 3.6E+02 | X |
| 8 | Al 15.7% | 4.6E+05 | X |
| 9 | Zn 5.0% | 1.0E+04 | X |
| 10 | Cr 19.4% | 6.3E+02 | X |
| 11 | Mo 16.4% | 4.5E+02 | X |
| 12 | Ta 15.2% | 9.1E+03 | X |
| 13 | Ru 15.1% | 5.0E+01 | O |
| 14 | Sn 11.3% | 5.3E+04 | X |
| 15 | Mn 17.8% | 2.1E+03 | X |
| 16 | Zr 14.7% | 2.4E+03 | X |

According to Table 1, about each of No. 1, wherein no Pd was contained in the carbon coating film, and Nos. 7-12, and 14-16, which each contained any one of W, Al, Zn, Cr, Mo, Ta, Sn, Mn and Zr, which are elements other than Pd, the contact resistance had largely risen after the standing-still at room temperature, so that these samples were unable to satisfy the passing criterion for the present invention (judgment: X). No. 2, wherein the Pd content by percentage was less than the preferred range thereof in the invention, did not gain desired properties, either.

By contrast, Nos. 3-6, which were each an example wherein Pd described in the invention was contained in a content by percentage more than the preferred lower limit in the invention, each succeeded in having been effectively restrained from rising in contact resistance after the standing-still at room temperature (judgment: O).

No. 13, which was an example wherein Ru not described in the invention was contained, succeeded in having been effectively restrained from rising in contact resistance after the standing-still at room temperature (judgment: O).

It is understood from the results in Table 1 that the use of Pd and Ru is effective for causing an electrical contact member to have ensured a stable contact resistance after the member is allowed to stand still at room temperature.

Example 2

In the present example, electrical contact members each having a carbon coating film containing any one of various metal elements shown in Table 2 were produced to examine the usefulness of Pd (effect of having decreased the contact resistance after the members were repeatedly subjected to contacting at high temperature).

Specifically, as each contact probe, a spring built-in probe (YPW-6XA03-062, manufactured by Yokowo Co., Ltd.), the tip of which was in a round form, was used to form a contact probe in the same way as in Example 1 described above except that any one of the additive element shown in Table 2 was contained therein. Each of the resultant contact probes was used, and brought into contact with an electrode that was a pure-Sn electrode at 85° C. 100,000 times. In the same way as in Example 1, it was measured whether or not the contact resistance was raised by the adhesion of Sn onto the tip of the contact probe. Specifically, whenever the probe was brought into contact therewith 100 times, a current of 100 mA was passed one time through the probe to measure the contact resistance. At 85° C., the contacting was performed 100,000 times. The contact resistance value at the first contacting, that at the $101^{th}$ contacting, . . . that at the 100,001$^{th}$ contacting were averaged to gain the contact resistance after the test. When this contact resistance was less than 300 mΩ, the electrical contact member was judged to be O. When this contact resistance was 300 mΩ or more, the electrical contact member was judged to be X.

These results are also shown in Table 2. At the initial of the test, each of the samples had a lower contact resistance of 50 mΩ although the value is not shown in Table 2.

TABLE 2

| No | Additive element (% by atom) | Contact resistance average (mΩ) | Judgment |
|---|---|---|---|
| 1 | No coating | 1865 | X |
| 2 | Not added | Arrival at measureable upper limit | X |
| 3 | Pd 10.3% | 78 | O |
| 4 | Pd 15.4% | 97 | O |
| 5 | Pd 19.1% | 116 | O |
| 6 | Pd 22.1% | 289 | O |
| 7 | Pd 23.6% | 585 | X |
| 8 | W 16.0% | 51 | O |
| 9 | Cr 20.3% | 438 | X |
| 10 | Ru 15.0% | 2731 | X |

In Table 2, about No. 1, which was a sample having no coat, according to the high-temperature test, Sn adhered thereto so that the contact resistance after the high-temperature test was 1865 mΩ, which had remarkably risen. About No. 2, which was a sample wherein the carbon coating film contained no additive element, the contact resistance turned very high to reach the measurable upper limit (3Ω).

About No. 7, which was a sample wherein the Pd content by percentage was more than the preferred range thereof in the invention, Sn had adhered thereto according to the high-temperature test, so that after the test this sample had been increased in contact resistance, not to gain desired properties (judgment: X).

About No. 9, which was a sample into which Cr not described in the invention was added, Sn had adhered thereto after the high-temperature test not to gain desired properties (judgment: X). As shown in No. 10 in Table 1, it was verified about Cr that a sample wherein Cr was added in a similar content by percentage also had increased in contact resistance after allowed to stand still at room temperature.

No. 10 was a sample into which Ru was added. No. 13 in Table 1 described above had, according to the addition of Ru in a similar content by percentage, the effect of having decreased the contact resistance after allowed to stand still at room temperature. However, it was verified about No. 10 that after the high-temperature test, Sn had adhered to the surface thereof and thus this sample had been remarkably increased in contact resistance, not to have succeeded in ensuring desired properties.

By contrast, about Nos. 3-6, which were each a sample wherein Pd described in the invention was contained in the preferred range (defined by the upper and lower limits) in the invention, Sn had not adhered thereto even after the high-temperature test. The samples succeeded in having been restrained from rising in contact resistance after the test (judgment: O).

No. 8 was a sample into which W was added. It was verified that No. 7 described above in Table 1 had no effect of having decreased the contact resistance after the addition of W in a similar proportion followed by the standing-still at room temperature (judgment: X in Table 1). However, it was verified that the adhesion of Sn had not been observed after the high-temperature test, so that a rise in the contact resistance had been effectively restrained (judgment: O in Table 2).

When these results in Tables 1 and 2 are synthetically considered, it has been verified that in the case of using a contact probe having a carbon coating film having a surface layer in which Pd is contained in a proportion in the range in the invention, the adhesion thereof to Sn, which is a test subject, is restrained, so that the probe has been certainly restrained from rising in contact resistance not only after allowed to stand still at room temperature over a long term but also after subjected to a repetitive test at high temperature.

By contrast, it has been understood that in the case of using a metal other than Pd, the probe rises in contact resistance under each of the two tests, or the probe cannot clear test conditions in the two tests although the probe exhibits a good property under either one of the test conditions.

Example 3

Each silicon wafer inclined at 45° from the vertical direction was arranged at the same position as the tip portion of any one of the contact probes arranged in Example 1 (the inclined surface of the contact probe was simulated). Carbon coating films were then deposited onto the respective silicon wafers. The film-deposition was performed, using the same film-depositing apparatus and conditions as in Example 1 while the film thickness of the carbon coating films was varied as well as the concentration which was the content by percentage of Pd in the carbon coating films. The reason why the silicon wafers were used as their bases is to attain purposes of causing that irregularities in the surface of each of the bases not to affect irregularities in the outermost surface of the carbon coating film, and relieving technical difficulties in AFM measurement at the fine tip portion. For comparison, the same film was deposited onto a silicon wafer arranged in parallel to the sputtering target (i.e., in the horizontal direction, which was at an angle of 90° from the vertical direction).

A test was made about a relationship between the arithmetic average roughness Ra measured in a region of 3 μm×3 μm size of each of the carbon coating films on the respective silicon wafers inclined at 45° from the vertical direction, and the adhesion of Sn. As a result, it was made clear that when the Ra was 3 nm or less, the Sn adhesion was restrained. Thus, while the film thickness of the carbon coating films was varied as well as the content by percentage of Pd in the carbon coating films, the Ra of the samples was measured. Any one, out of the samples, wherein the Ra was 3 nm or less was judged to be O. Any one, out of the samples, wherein the Ra was more than 3 nm was judged to be X. The results are shown in Table 3. It was made clear that about any sample inclined at 45°, the roughness tends to increase as the film thickness is increased in proportion thereto. Thus, one, out of the data in Table 3, on the sample wherein the film thickness was 200 nm was gained from a straight line through which the Ra data when the film thickness was 100 nm and 400 nm were joined to each other. In Table 3, the film thickness of the carbon coating films and the content of Pd in the carbon coating films are values in terms of the film thickness and the Pd content of carbon coating films deposited on a silicon wafer arranged horizontally.

TABLE 3

| | | Pd concentration (% by atom) | | | | |
|---|---|---|---|---|---|---|
| | | 20 | 23 | 30 | 32 | 47 |
| Film thickness (nm) | 20 | ○ | ○ | ○ | ○ | ○ |
| | 50 | ○ | ○ | ○ | ○ | ○ |
| | 100 | ○ | ○ | ○ | ○ | ○ |
| | (200) | ○ | ○ | ○ | ○ | ○ |
| | 400 | ○ | ○ | X | X | X |

From Table 3, it is understood that: in a case where the content by percentage of Pd in the carbon coating films was 23% or less by atom, the Ra was 3 nm or less (in other words, the Sn adhesion was restrained) even when the film thickness was any one of the shown thicknesses; and when the film thickness was particularly 200 nm or less, the Sn adhesion succeeded in being restrained over such a range that the Pd content was over about 23% by atom and not more than about 50% by atom.

According to the Ra-measured result of the sample arranged horizontally (angle from the vertical direction: 90°), the Ra values were each a very small value more than 0.1 nm and less than 0.3 nm over the respective ranges shown in Table 3 about the film thickness and the Pd content by percentage. Thus, the Ra was not affected by the film thickness nor the Pd content. This demonstrates that: in a case where the angle from the vertical direction is 90° (in other words, about any electrical contact member such as a contact probe, in the case of its surface perpendicular to its axial line), the Sn-adhesion-restraining effect is hardly affected in this region even when the film thickness and the Pd content are controlled; and in a case where a silicon wafer is inclined at an angle of about 40 to 50° from the vertical direction (in other words, about any electrical contact member such as a contact probe, in the case of its surface inclined at an angle of about 40 to 50° from its axial line), it is very effective for controlling the surface roughness thereof to control the film thickness and the Pd content.

The present application has been described in detail or with reference to the specific embodiments. However, it is evident for those skilled in the art that various changes or modifications can be added thereto without causing the resultants to depart from the spirit and scope of the invention.

The present application is based on Japanese Patent Application (No. 2011-133483) filed on Jun. 15, 2011, and the contents thereof are incorporated hereinto by reference.

INDUSTRIAL APPLICABILITY

About the electrical contact member of the invention, a surface of the member that is to come into contact with a test subject is a carbon coating film containing Pd, and the Pd content by percentage in the carbon coating film is preferably controlled into appropriate values. Thus, the member is able to have realized a low adhesiveness onto the test subject and further have been restrained from rising in contact resistance even after brought into contact with the test subject at a high temperature of about 85° C., and allowed to stand still in the atmosphere for a long term. Thus, the member can keep stable electrical contacting over a long term.

The invention claimed is:

1. An electrical contact member configured to contact a test subject repeatedly, wherein a surface of the electrical contact member configured to come into contact with the test subject is a carbon coating film that comprises Pd, and
wherein the electrical contact member has a topmost surface comprised of a Be—Cu alloy, a layer of an Au—Co alloy present on the topmost surface, a Layer of Ni on said layer of an Au—Co alloy, a layer of Cr on said layer of Ni, and said carbon coating film that comprises Pd present on said layer of Ni.

2. The electrical contact member according to claim 1, wherein
the content by percentage of Pd present in the carbon coating film is from 10 to 50% by atom.

3. The electrical contact member according to claim 2, wherein the content by percentage of Pd present in the carbon coating film is from 10 to 23% by atom.

4. The electrical contact member according to claim 1, wherein the carbon coating film has a thickness of 5 nm to 10 μm.

5. The electrical contact member according to claim 2, wherein the carbon coating film has a thickness of 5 nm to 10 μm.

6. The electrical contact member according to claim 3, wherein the carbon coating film has a thickness of 5 nm to 10 μm.

7. The electrical contact member according to claim 1, wherein
the carbon coating film has a thickness of 5 nm to 200 nm, and the content by percentage of Pd present in the carbon coating film is from 10 to 23% by atom.

8. The electrical contact member according to claim 1, wherein the test subject to be examined comprises Sn.

9. A connecting device for examination, comprising the electrical contact members as recited in claim 1.

10. A connecting device for examination, comprising the electrical contact members as recited in claim 8.

11. The electrical contact member according to claim 1, wherein
the carbon coating film has a thickness of 5 to 200 nm, and the content by percentage of Pd present in the carbon coating film is from 10 to 50% by atom.

12. The electrical contact member according to claim 1, wherein
the carbon coating film has a thickness of 5 to 200 nm, and the content by percentage of Pd present in the carbon coating film is from 15 to 40% by atom.

13. The electrical contact member according to claim 1, wherein
the carbon coating film has a thickness of 5 to 200 nm, and the content by percentage of Pd present in the carbon coating film is from 20 to 35% by atom.

14. The electrical contact member according to claim 1, wherein
the carbon coating film has a thickness of 5 nm to 600 nm, and
the content by percentage of Pd present in the carbon coating film is from 10 to 23% by atom.

15. The electrical contact member according to claim 1, wherein
the carbon coating film has a thickness of 5 nm to 400 nm, and
the content by percentage of Pd present in the carbon coating film is from 10 to 23% by atom.

* * * * *